United States Patent
Summerfelt

Patent Number: 6,117,689
Date of Patent: Sep. 12, 2000

[54] STABLE HIGH-DIELECTRIC-CONSTANT MATERIAL ELECTRODE AND METHOD

[75] Inventor: Scott R. Summerfelt, Garland, Tex.

[73] Assignee: Texas Instruments Incorporated, Dallas, Tex.

[21] Appl. No.: 09/217,758

[22] Filed: Dec. 21, 1998

Related U.S. Application Data

[60] Provisional application No. 60/068,680, Dec. 24, 1997.

[51] Int. Cl.$^7$ .................................................. H01L 21/70
[52] U.S. Cl. ............................... 438/3; 438/396; 438/240
[58] Field of Search .............................. 438/3, 240, 395, 438/396, 397, 632

[56] References Cited

U.S. PATENT DOCUMENTS

| | | | |
|---|---|---|---|
| 5,585,300 | 12/1996 | Summerfelt | 438/3 |
| 5,665,628 | 9/1997 | Summerfelt | 438/3 |
| 5,686,339 | 11/1997 | Lee et al. | 257/306 |
| 5,879,956 | 3/1999 | Seon et al. | 438/3 |
| 5,943,547 | 8/1999 | Yamamichi et al. | 438/3 |
| 5,981,331 | 11/1999 | Tsunemine | 438/240 |
| 6,001,660 | 12/1997 | Park et al. | 438/3 |

OTHER PUBLICATIONS

Eimori et al., "A Newly Designed Planar Stacked Capacitor Cell with High Dielectric Constant Film for 256 Mbit DRAM," 1993, EDM, 93–631, 26.3.1.

Takemura et al., "Barrier Mechanism of Pt/Ta and Pt/Ti Layers for SrTiO3 Thin Film Capacitors on Si," 1992, 4th Inter Symp on Integrated Ferroelectrics, 481–488.

Grill et al., "Base Electrodes for High Dielectric Constant Oxide Materials in Silicon Technology," 1992, Journal of Materials Research, 7, 3260–3265.

Sreenivas et al., "Investigation of Pt/Ti Bilayer Metallization on Silicon for Ferroelectric Thin Film Integration," 1994, Journal of Applied Physics, 75, 232–239.

Fazan et al., "Stacked Capacitor Structures for 64Mb DRAMs and Beyond," 1992, Semiconductor International, 108–112.

Hren et al., "Hillock Formation in Pt Films," Accepted for Publication in Proc MRS, Spring 1992.

Tompkins, "Oxidation of Titanium Nitride in Air and Dry O2," 1991, Journal of Applied Physics, 70, 3876–3880.

Suni et al., "Thermal Oxidation of Reactively Sputtered Titanium Nitride and Hafnium Nitride Films," 1983, Journal of Electrochemical Society, 130, 1210–1214.

Wittmer et al., "Oxidation Kinetics of TiN Thin Films," 1981, Journal of Applied Physics, 52, 6659–6664.

Donohoe et al., "Mobility and Coalescence of Nuclei in Metal Vapour Deposition on Alkali Halide Substrates," 1972, Journal of Crystal Growth, North–Holland Publishing Co., 17, 70–76.

*Primary Examiner*—Donald L. Monin, Jr.
*Assistant Examiner*—Hoai Pham
*Attorney, Agent, or Firm*—David Denker; Wade James Brady, III; Frederick J. Telecky, Jr.

[57] ABSTRACT

A structure for, and method of forming, an oxygen diffusion resistant electrode for high-dielectric-constant materials is disclosed. The electrode comprises a single grain of an oxygen stable material over a barrier layer. The single crystal oxygen stable layer is generally substantially impervious to oxygen diffusion at all relevant deposition and annealing temperatures. The disclosed structure is an integrated circuit comprising an array of microelectronic structures, with each of the microelectronic structures comprising an oxidizable layer (e.g., polysilicon 50), a barrier layer (e.g. TiN 64) overlying the oxidizable layer, a single crystal oxygen stable layer (e.g., Pt 98) overlying the barrier layer, and a high-dielectric-constant material layer (e.g., barium strontium titanate 36) overlying the oxygen stable layer. The disclosed method of fabricating an integrated circuit comprises forming an array of microelectronic structures, wherein forming each of said microelectronic structures comprises forming a barrier layer on an oxidizable layer, depositing a single crystal oxygen stable layer on the barrier layer, and depositing a high-dielectric-constant material layer on the oxygen stable layer. The single crystal oxygen stable layer prevents oxidation of the barrier layer and the oxidizable layer during subsequent processing.

15 Claims, 8 Drawing Sheets

STABLE HIGH-DIELECTRIC-CONSTANT MATERIAL ELECTRODE AND METHOD

This application claims priority under 35 USC § 119 (e)(1) of provisional application Ser. No. 60/068,680 filed 12/24/97.

FIELD OF THE INVENTION

This invention generally relates to improving electrical connections to materials with high-dielectric-constants, and more particularly to electrodes with oxygen stable layers that are diffusion resistant.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits that can accomplish more functions in less time in a smaller package while consuming less power. Without limiting the scope of the invention, its background is described in connection with current methods of forming electrical connections to high-dielectric-constant materials used in integrated circuits, as an example.

The increasing density of integrated circuits (e.g., DRAMs) is increasing the need for materials with high-dielectric-constants to be used in electrical devices such as capacitors. Generally, capacitance is directly related to the surface area of the electrode in contact with the capacitor dielectric, but is not significantly affected by the electrode volume. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability, however, for devices such as the 256 Mbit and 1 Gbit DRAMs.

An alternative approach is to use a high permittivity dielectric material. Many perovskite. ferroelectric, or high-dielectric-constant (HDC) materials such as $(Ba,Sr)TiO_3$ (BST) usually have much larger capacitance densities than standard $SiO_2$-$Si_3N_4$-$SiO_2$ capacitors. Various metals and metallic compounds, and typically noble metals such as Pt and conductive oxides such as $RuO_2$, have been proposed as the electrodes for these HDC materials. To be useful in electronic devices, however. reliable electrical connections should generally be constructed which do not diminish the beneficial properties of these high-dielectric-constant materials.

Heretofore in this field, single and multiple metal layers are generally used to form electrical contacts to high-dielectric-constant materials. For example, to provide an electrical connection to a high-dielectric-constant material which makes up a capacitor on the surface of a semiconductor substrate, the following structures are among those that have been proposed: (1) substrate/platinum/dielectric, (2) substrate/tantalum/platinum/dielectric, (3) substrate/titanium/platinum/dielectric, and (4) substrate/titanium nitride/platinum/dielectric, where the layering sequence is from the substrate (e.g. silicon) to the HDC layer. Most layering schemes are for high density devices where current flows directly from the bottom electrode to the substrate due to unit area constraints. These layering schemes have the general structure: substrate/oxidizable layer/barrier layer/oxygen stable layer/high-dielectric-constant material. A similar metallization scheme, using the appropriate layers from above, may be used for the top electrode connected to the dielectric film, thus completing the capacitor structure.

SUMMARY OF THE INVENTION

As used herein, the term "high-dielectric-constant" or "HDC" means a dielectric constant greater than about 10, and preferably greater than about 20, at device operating temperature. HDC materials are useful for the fabrication of many electrical devices, such as capacitors. However, HDC materials are generally not chemically stable when deposited directly on a semiconductor substrate, so one or more additional layers are required to provide the electrical connection between the HDC material and the substrate. The additional layer or layers should generally be chemically stable when in contact with the substrate and also when in contact with the high-dielectric-constant material.

Current methods propose using platinum as the oxygen stable layer to contact the high-dielectric-constant material, along with tantalum, titanium or titanium nitride as the barrier/adhesion layer to contact the substrate. However, HDC materials (e.g. ferroelectrics) are generally deposited at elevated temperatures (greater than about 500° C.) in an oxygen-containing atmosphere. It has been discovered that, in this environment, oxygen diffuses through the platinum and forms a resistive layer of tantalum oxide or titanium oxide when it comes in contact with the Ta, Ti or TiN, causing high contact resistance and degraded capacitor leakage current due to roughening of the bottom electrode. One of the principle problems with the oxygen stable layer of prior art structures is that it is polycrystalline, and thus has grain boundaries which allow diffusion of oxygen. The present invention recognizes this problem and generally provides for the formation of a single grain of the oxygen stable material over the barrier layer. A single crystal is generally substantially impervious to oxygen diffusion at all relevant deposition and annealing temperatures.

The disclosed structures therefore generally provide electrical connections to HDC materials without the disadvantages of prior art structures. One preferred embodiment of this invention is an integrated circuit comprising an array of microelectronic structures, with each of the microelectronic structures comprising an oxidizable layer, a barrier layer overlying the oxidizable layer, a single crystal oxygen stable layer overlying the barrier layer, and a high-dielectric-constant material layer overlying the oxygen stable layer.

In accordance with a preferred embodiment of the present invention, there is disclosed a method of fabricating an integrated circuit comprising forming an array of microelectronic structures. wherein forming each of said microelectronic structures comprises forming a barrier layer on an oxidizable layer, depositing a single crystal oxygen stable layer on the barrier layer. and depositing a high-dielectric-constant material layer on the oxygen stable layer. The single crystal oxygen stable layer prevents oxidation of the barrier layer and the oxidizable layer.

An advantage of the inventive concepts is that the featured structures/methods provide a single grain oxygen stable layer over a barrier layer, thus substantially preventing the diffusion of oxygen to the barrier layer during subsequent processing. The present invention may also be useful for multilayer capacitors and other thin-film devices such as MOS transistors, non-volatile ferroelectric RAMs, pixels for light detecting arrays, and electrooptic applications

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1A:
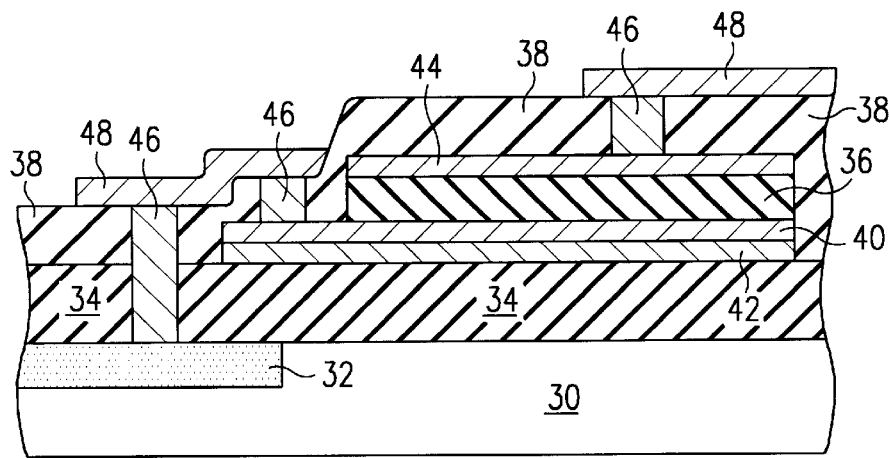
FIGS. 1a–c are cross-sectional views of various HDC material capacitor structures.

Although this technique is not limited to any particular structure (e.g. a recessed plug as discussed below is not necessary), the following discussion concentrates on particular structures with the understanding that the concepts apply equally as well to other structures and materials (barrier. oxygen stable, and HDC materials).

There are several considerations which favor barrier layers that either are shape-stable with respect to oxygen or oxidize very slowly. To illustrate the reasons for this. refer to FIG. 1, which shows three examples of structures for HDC materials in an integrated semiconductor device. The devices in FIG. 1 comprise semiconductor or semiconductor coated substrate 30. conductive doped regions 32 in semiconductor substrate 30, lower interlayer dielectric (typically $SiO_2$) 34, high-dielectric-constant material 36, upper interlayer dielectric (typically $SiO_2$) 38, oxygen stable layer 40, barrier layer 42, top electrode 44, interlevel metallization 46, top level metallization 48, and (in FIG. 1c) conductive plug 50, which provides electrical contact between the bottom electrode and the conductive layers in the substrate.

Figure 1B:
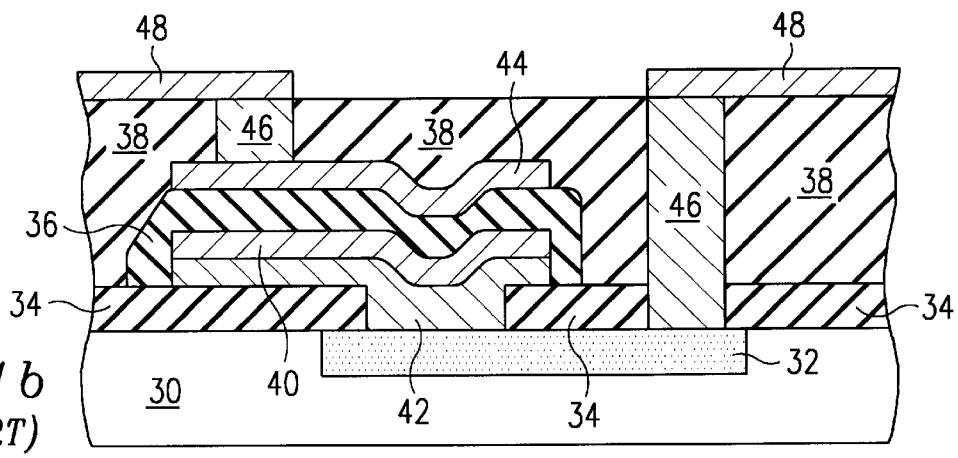

The bottom electrode in FIG. 1a is generally suitable only for low density devices because there is no direct path for the current from the bottom electrode to the substrate. In this case, barrier layer 42 does not need to be conductive after deposition of the HDC material. In contrast, barrier layer 42 does need to remain conductive in FIG. 1b and FIG. 1c, but these devices can be used in high density devices. An additional problem exists when using the structures shown in FIG. 1b and FIG. 1c. Barrier layer 42 is directly exposed to the oxidizing conditions present during the deposition of the HDC material 36 on the sides not covered by oxygen stable layer 40. Many potential barrier materials such as TiN oxidize rapidly if directly exposed during deposition of an HDC layer (see, e.g., Tompkins, "Oxidation of Titanium Nitride in Air and Dry $O_2$," 70 J. of Applied Physics 3876–80 (1991), Suni, et al., "Thermal Oxidation of Reactively Sputtered Titanium Nitride and Hafnium Nitride Films," 130 J. of Electrochemical Society 1210–14 (1983), Wittmer, et al., "Oxidation Kinetics of TiN Thin Films," 52 J. of Applied Physics 6659–64 (1981)). This oxidation can cause severe problems as seen in FIGS. 2 and 3, which show a bottom electrode before and after oxidation.

Figure 1C:
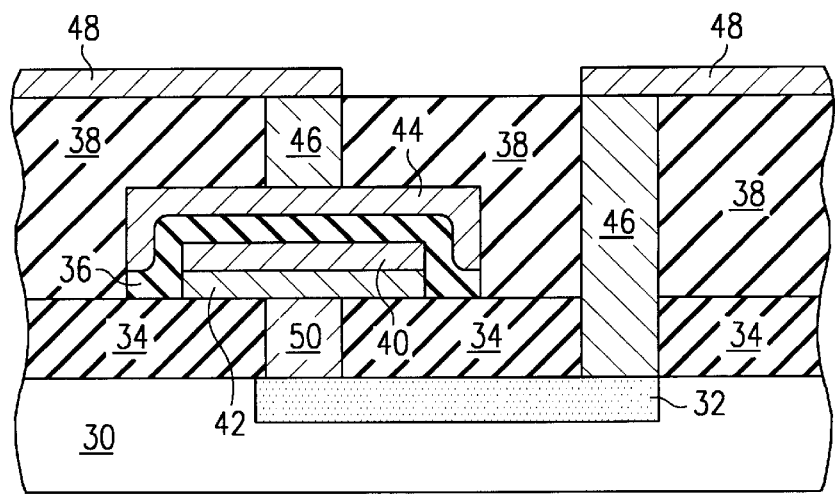
Figure 2:
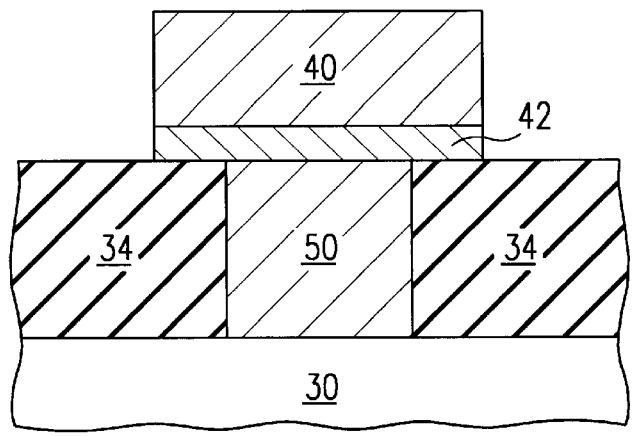
FIG. 2 is a cross-sectional view of the lower electrode of FIG. 1c.
Figure 3:
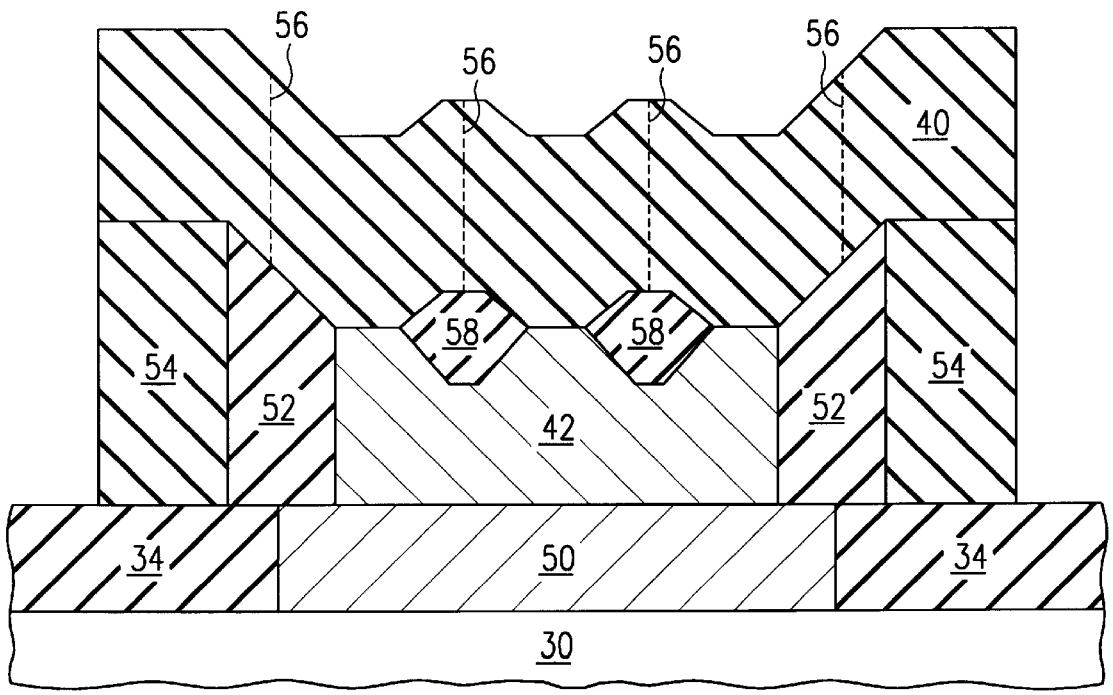
FIG. 3 is a cross-sectional view of the lower electrode of FIG. 1c after oxidation.

FIG. 2 illustrates an intermediate step in forming the device of FIG. 1c, wherein the bottom electrode (barrier layer 42 and oxygen stable layer 40) is formed on semiconductor substrate 30 (note that substrate 30 can comprise conductive doped portions even if not shown in the figure). In this example. oxygen stable layer 40 is Pt, barrier layer 42 is TiN, and oxidizable layer 50 is a poly-Si plug. FIG. 3 shows the structure after oxidation, which occurs during deposition of a high-dielectric-constant layer (not shown), or during subsequent oxygen annealing. The oxidation of barrier layer 42 occurs by direct oxidation of the sides of barrier layer 42 and by oxygen diffusion through the oxygen stable layer 40. On the exposed sides, low dielectric constant layers readily form. in this case partially oxidized $TiO_x$ 52 and oxidized $TiO_2$ 54. Even though the surface of barrier layer 42 is covered by oxygen stable Pt layer 40, portions of it become oxidized also. At temperatures and times typical for the deposition of the HDC layer (<800° C. and <1 hr), the oxygen diffusion rate through single crystal Pt can be considered to be zero or negligible. Prior art Pt layer 40, however, is polycrystalline and allows diffusion of oxygen through its grain boundaries 56 (shown in FIG. 3, but not FIG. 2). Barrier layer 42 is oxidized in the areas below the grain boundaries, forming partially oxidized TiOx, or oxidized $TiO_2$ 58, as shown. This oxidized area could even completely or substantially completely oxidize the entire top surface of barrier layer 42, depending its susceptibility to oxidation, the number of grain boundaries in oxygen stable layer 40, and the specific HDC deposition ambient. Both the lateral oxidation and diffusion oxidation cause several problems and seriously degrade the characteristics of the barrier layer, and thus of the overall device.

Figure 4:
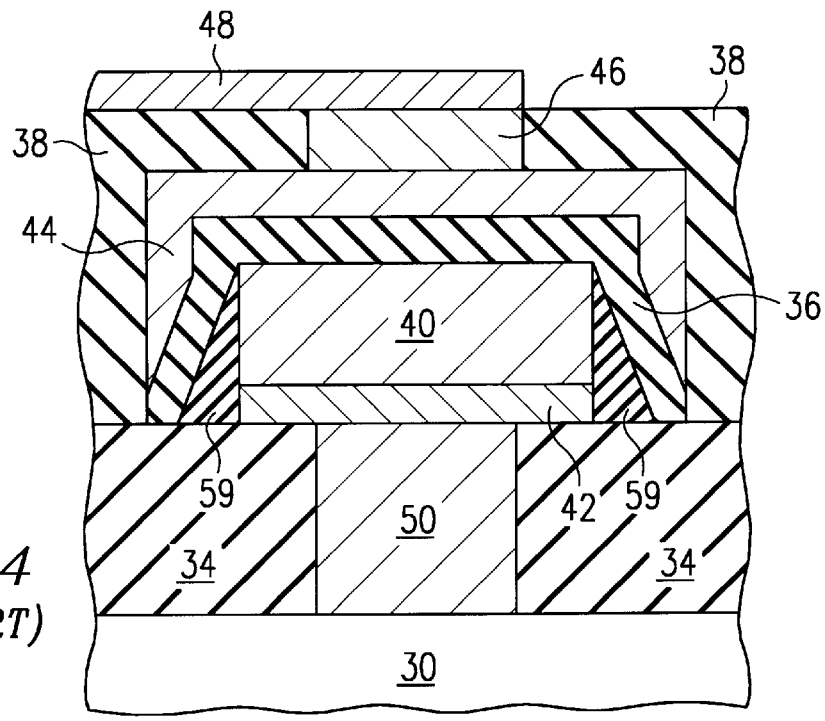
FIG. 4 is a cross-sectional view of an HDC material capacitor with sidewalls.
Figure 5:
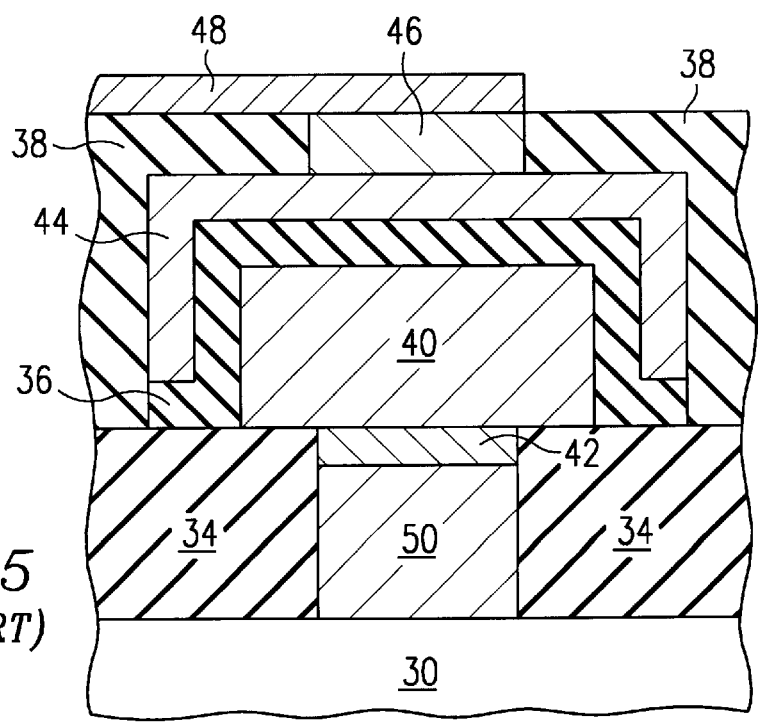
FIG. 5 is a cross-sectional view of an HDC material capacitor with the barrier layer located in the plug.
Figure 6A:
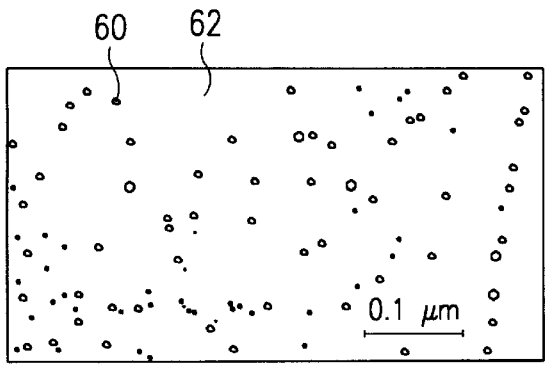
FIGS. 6a–h are top-down views of an NaCl substrate showing the progressive steps of Au deposition and grain growth.
Figure 6B:
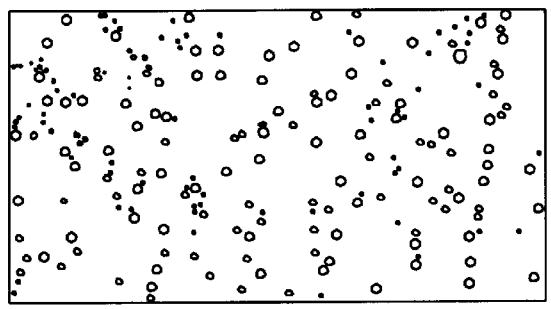
Figure 6C:
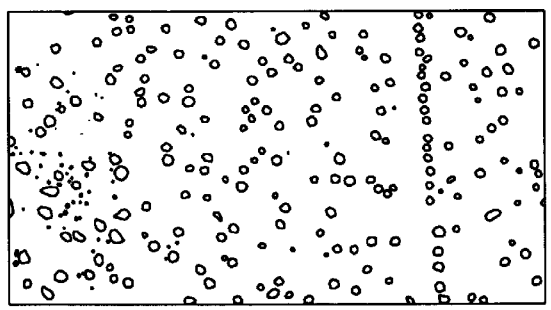
Figure 6D:
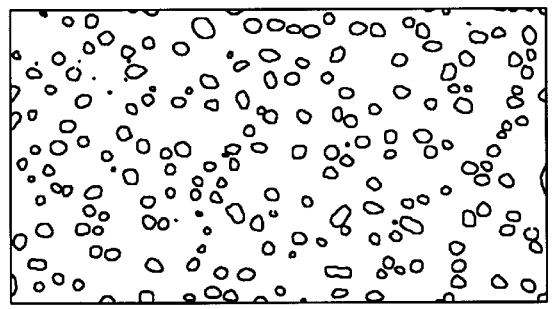
Figure 6E:
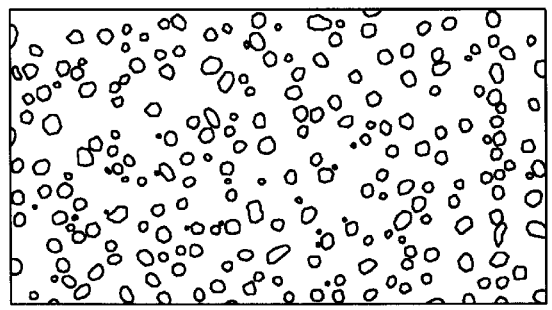
Figure 6F:
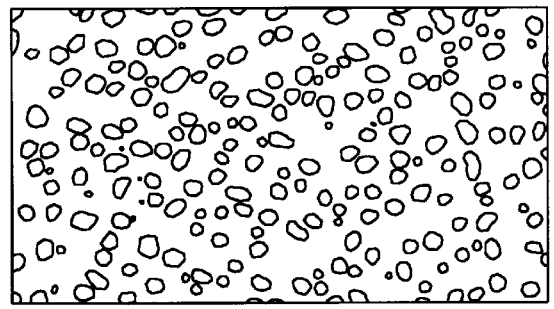
Figure 6G:
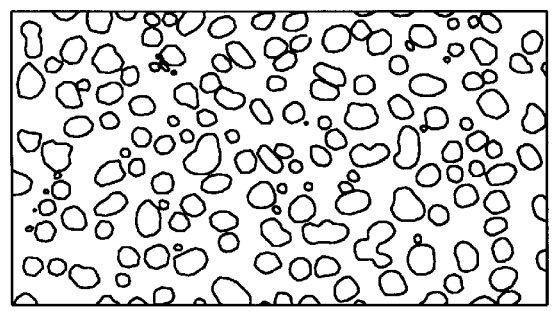
Figure 6H:
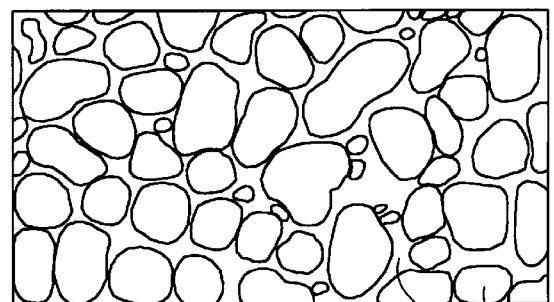

Other structures, as exemplified by FIGS. 4 and 5, have been proposed to solve the first problem (lateral or direct oxidation). The structure shown in FIG. 4 attempts to solve the problem of direct lateral oxidation of barrier layer 42 by forming oxygen barrier layer 59 ($SiO_2$), to protect barrier layer 42 from direct exposure to oxygen (Eimori, et al., "A Newly Designed Planar Stacked Capacitor Cell with High Dielectric Constant Film for 256 Mbit DRAM," EDM 93–631, 26.3.1 (1993)). One of the problems with the structure shown in FIG. 4 is that it coats the sidewalls of oxygen stable layer 40 and barrier layer 42 with a nonconductive layer, whicredreduces the useful conductive surface a For extremely small structures such as those required for 1 Gbit DRAMs, the conductive surface area of the bottom electrode sidewalls is preferably larger than that of the bottom electrode top, in order to minimize the unit area of the device. To allow the sidewalls to be used as part of the capacitor, the recessed plug structure proposed in FIG. 5 shelters barrier layer 42 in the plug, underneath and completely covered by oxygen stable layer 40. An alternative to this is for the barrier layer to extend partially out of the plug, or for it to be completely out of the plug. as long as It is completely covered by a conductive oxygen stable layer, Such as Pt layer 40. Similarly, the device of FIG. 4 could substitute a conductive sidewall instead of a nonconduIctiv,e one. Despite preventing direct exposure of barrier layer 42 to oxygen, these structures still have the second problem discussed above, that of allowing oxygen to diffuse through the grain boundaries of oxygen stable layer 40 and react with barrier layer 42. The actual oxidation kinetics of a particular barrier layer underneath an oxygen stable layer are sensitive to deposition technique, thickness of the oxygen stable layer, and composition and processing of the barrier layer (Takemura, et al., "Barrier Mechanism of Pt/Ta and Pt/Ti Lavers for $SrTiO_3$ Thin Film Capacitors on Si." 4th Inter. Symp. on Integrated Ferroelectrics 481–88 (t992), Grill, et al. "Base Electrodes for High Dielectric Constant Oxide Materials in Silicon Technology," 7 J. of Materials Research 3260–65 (1992), Sreenivas. et al. "Investigation of Pt/Ti Bilayer Metallization on Silicon for Ferroelectric Thin Film Integration," 75 J. of Applied Physics 232–39 (1994)).

Given that a structure, such as those shown in FIG. 4 or 5, can protect barrier layer 42 from direct exposure to oxygen, it is still very desirable to reduce the rate of oxygen transfer through oxygen stable layer 40 down to barrier layer 42. One of the principle problems with the oxygen stable layer of prior art structures is that it is polycrystalline, and thus has grain boundaries which allow diffusion of oxygen. The present invention recognizes this problem and presents the novel solution of forming a single ,rain of the oxygen stable material over the barrier layer. As discussed above, a single crystal is substantially impervious to oxygen diffusion at all relevant deposition and annealing, temperatures. Even if the barrier layer does not require more protection from oxygen made possible by the present invention, a single grain per plug is still attractive in providing a more consistently reproducible and stable bottom electrode. The instant invention is generally made possible because of the relative sizes of the barrier layer- for very high density structures compared to the grain sizes of the oxygen stable layer which can be achieved. The instant invention is different from "epitaxial" growth because that requires forming epitaxial layers all the way from the substrate to the oxygen stable layer. Because the dominant oxygen conduction mechanism is via the grain boundaries, forming a single grain over each plug will result in much less oxygen diffusion to the barrier layer and hence more stable bottom electrodes. In the following discussion, while Pt is used as the oxygen stable layer and TiN is used as the barrier layer, this invention is applicable to almost all other oxygen stable layers and barrier layers.

As production photolithography technology progresses, resolution limits continue to improve resulting in shrinking devices and hence lower costs per device. One major application for HDC materials is to create either volatile or non-volatile memory devices. These type of devices will probably use structures similar to that shown in FIGs. 1c, 4 or 5.The diameter of the plugs for future DRAM devices is expected to be approximately that shown in the following table (Fazan, et al., "Stacked Capacitor Structures for 64Mb DRAMs and Beyond," Semiconductor International, 108–12 (1992)):

TABLE 1

| Memory Capacity | Plug Diameter |
| --- | --- |
| 1 Mbit | 1 $\mu$m |
| 4 Mbit | 0.8 $\mu$m |
| 16 Mbit | 0.5 $\mu$m |
| 64 Mbit | 0.35 $\mu$m |
| 256 Mbit | 0.25 $\mu$m |
| 1 Gbit | 0.15 $\mu$m |

Pt grain sizes vary by deposition technique, procedure, and substrate temperature. For example, Pt grain sizes for 100 nm thick Pt films created by DC sputter deposition were varied between 40 nm at room temperature deposition to 160 nm at 600° C. Pt grain sizes for 100 nm thick Pt films created by e-beam deposition were approximately 250 nm for 300° C. deposition temperatures. If a random polycrystalline film of 100 nm Pt is deposited by e-beam deposition over an array of 0.15 $\mu$m recessed TiN plugs such as that shown in FIG. 5, then some plugs will not have any Pt grain boundaries above them while other plugs will have one or more grain boundaries. If this sample is oxidized. such as during deposition or annealing of the HDC layer. the plugs without grain boundaries will be extremely stable while plugs with grain boundaries will suffer varying degrees of degradation.

A preferred embodiment of the instant patent provides (1) a new structure consisting of a single oxygen stable layer over each plug and (2) forms a single grain over each plug on an integrated circuit, instead of just over a random few plugs (which can occur by chance when using prior art deposition procedures). With integrated circuits containing hundreds, thousands. or millions of these devices, the randomness of the prior art techniques is unacceptable. While the methods and structures of the present invention will generally only work for plugs below a particular diameter— it is very difficult to form a Pt layer without grain boundaries over very large plugs (>10 $\mu$m)—this is not a significant impediment since large scale application of HDC materials will probably occur when the plug diameters are small (<0.35 $\mu$m).

In order to form only one single grain boundary over each plug, it is necessary to control the nucleation of Pt grains. Nucleation in general has been studied and FIG. 6 shows a typical series of electron microscope images showing gold deposits 60 on NaCl surface 62 for different deposition times (Donohoe and Robins, 1972). The micrographs show the sequence of nucleation and growth of the nuclei as the nuclei coalesce to form a continuous film. In this example, the gold layer is formed with a deposition rate of $1\times10^{13}$ atoms/ $(cm^2 *sec)$ and a substrate temperature of 250° C. The deposition times in each figure are shown in the following table:

TABLE 2

| FIG. | Deposition Time |
| --- | --- |
| 6a | 0.5 min. |
| 6b | 1.5 min. |

TABLE 2-continued

| FIG. | Deposition Time |
|---|---|
| 6c | 4 min. |
| 6d | 8 min. |
| 6e | 10 min. |
| 6f | 15 min. |
| 6g | 30 min. |
| 6h | 85 min. |

In general, the nuclei have a particular spacing which will remain relatively constant during growth. until coalescence. This nuclei spacing generally directly influences the final grain size of the film. Once one nucleus has formed, its presence generally prevents the formation of other nuclei in its vicinity. The instant invention takes advantage of this characteristic of grain formation/growth to control the nuclei density. Generally, there are two issues to address in ensuring that no grain boundaries form over any of the plugs on an integrated circuit: (1) separating nucleation on the plug from that off the plug, and (2) forcing the growth of only one grain on a plug.

Figure 7:
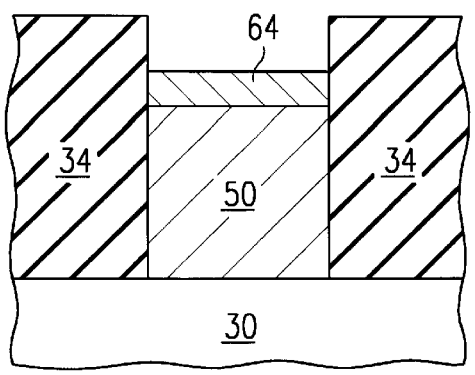
FIG. 7 is a cross-sectional view of a microelectronic structure comprising a recessed barrier layer.

The first step is to separate Pt nucleation on the plug from Pt nucleation off the plug. One way to accomplish this is by creating a region around the plug where no nucleation occurs, by further recessing the TiN 64 into the plug opening as shown in FIG. 7 (this may occur even without a recessed plug because of preferential nucleation of Pt on TiN over $SiO_2$). Poly-Si 50 is first deposited in the plug. Layer 64 is then formed, and comprises reactively sputtered TiN on $TiSi_2$. This layer is formed by depositing Ti and TiN, and then performing a rapid thermal anneal (RTA) at 800° C. for 30 sec. in an $N_2$ ambient. The thin silicide film portion of layer 64 is formed in order to reduce the contact resistance, and to provide a more reproducible contact resistance. The TiN layer is 100 nm thick and is recessed by 100 nm from the surface.

In alternative preferred embodiments, the plug may be recessed 50 nm, 25 nm or even 0 nm. While a larger recess is preferred for separating the nucleation sites, a smaller recess is generally preferred in terms of simpler processing, a thinner TiN layer, and less Pt required in order to achieve the same bottom electrode height.

Figure 8:
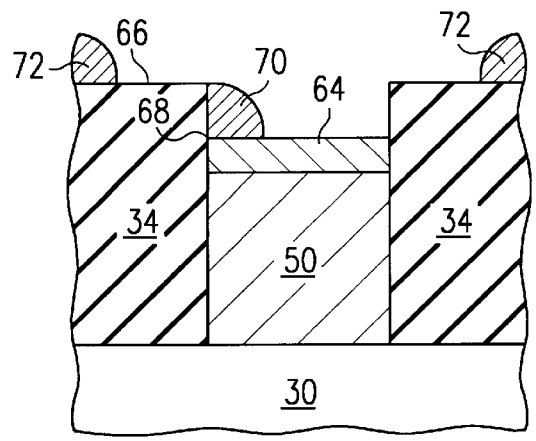
FIG. 8 is a cross-sectional view of Pt nuclei formed on the microelectronic structure of FIG. 7.

If Pt deposition is by a physical deposition technique such as sputtering, e-beam deposition or collimated sputtering, then some Pt nuclei 72 will form on the top surface 66 of $SiO_2$ layer 34, and some Pt nuclei 70 will form on recessed TiN 64 as shown in FIG. 8. Under proper deposition conditions, minimal or no Pt will deposit on the plug sidewalls. and the sidewalls will act as a means of separating nucleation on the plug from nucleation off the plug. Another advantage of recessing the sidewalls is that the sidewall/plug interface 68 acts as a low energy nucleation site for the Pt. This increases the probability that a nucleus will form in the plug prior to the formation of nuclei on the top surface.

Figure 9:
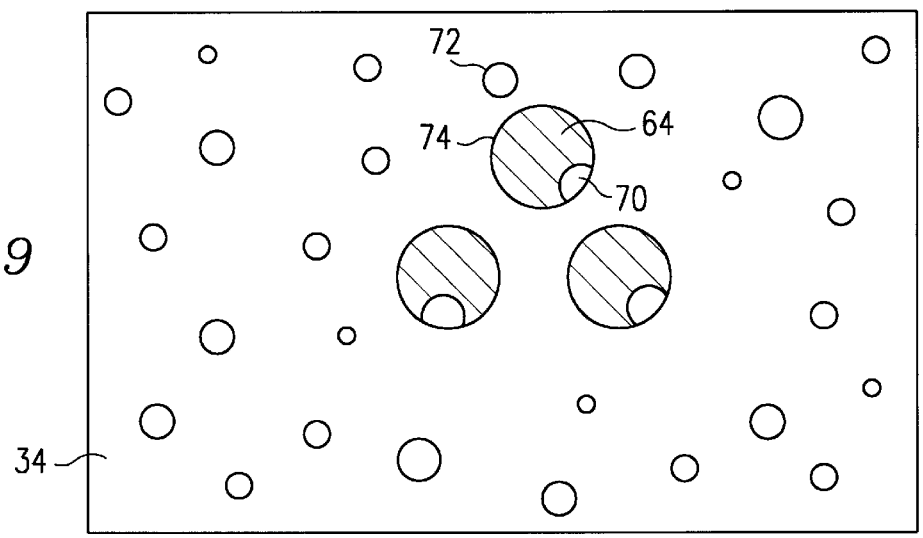
FIGS. 9–11 are top-down views of various microelectronic structures showing Pt nuclei formation and grain growth.

FIG. 9 illustrates a top view where the Pt nuclei spacing is approximately equal to the plug size. With the close spacing between plugs there might not be any nucleation of Pt between the plugs, because the Pt 70 will nucleate preferentially in the plugs 74 and then establish a depletion zone around the plugs 74. For this to function optimally, the sidewalls generally should not impede diffusion of Pt from the top surface to the Pt nucleus 70 inside the plug.

The result in FIG. 9 can be applied to the situation where the TiN is not recessed. Under these conditions, preferential Pt nucleation can still occur due to the lower interface energy between Pt and the TiN as compared to the Pt and $SiO_2$. The primary difference is that the nuclei on the non-recessed TiN would probably be more circular and their shape not as affected as much as those shown in FIG. 9. Most of the techniques discussed with respect to recessed TiN in the plugs are applicable to non-recessed TiN plugs, although they probably will not be quite as effective. While the above methods may be sufficient by themselves for structures where the plug diameter is about the same size as or smaller than the Pt nuclei spacing, the following methods should provide improved results for such structures, in addition to the larger plug diameter structures discussed below.

Figure 10:
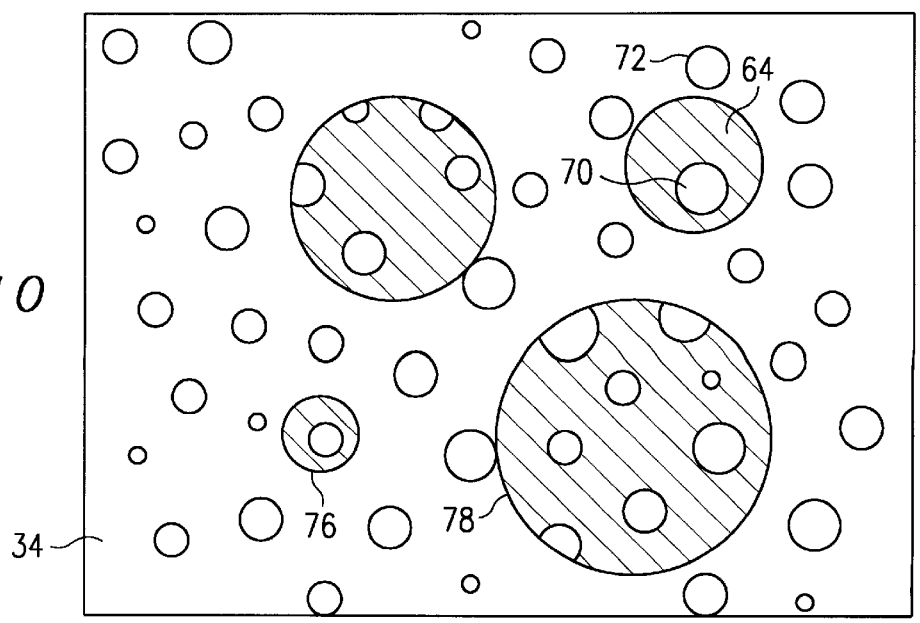

The second step in ensuring that no grain boundaries form over any of the plugs on an integrated circuit is to force the growth of only one grain on each plug. FIG. 10 illustrates the situation where the plug diameter is larger than the Pt nucleation spacing. As shown in this figure there will only be one nucleus formed in small plugs 76 but multiple nuclei formed in larger plugs 78. After further growth of the Pt until coalescence, the smallest plug 76 probably will not have any grain boundaries over it, the next smallest plug might have only a single grain boundary over a part of the plug, while the larger plugs 78 will have multiple grain boundaries over them. Three preferred embodiments are described below for improving this situation.

Figure 11A:
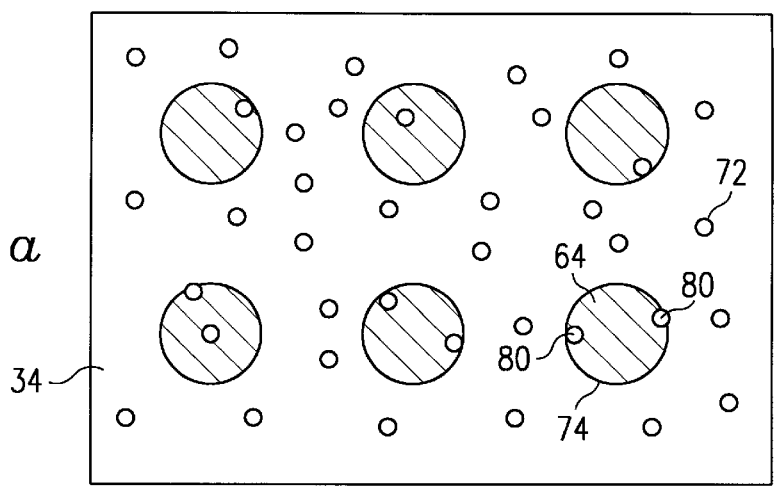
Figure 11B:
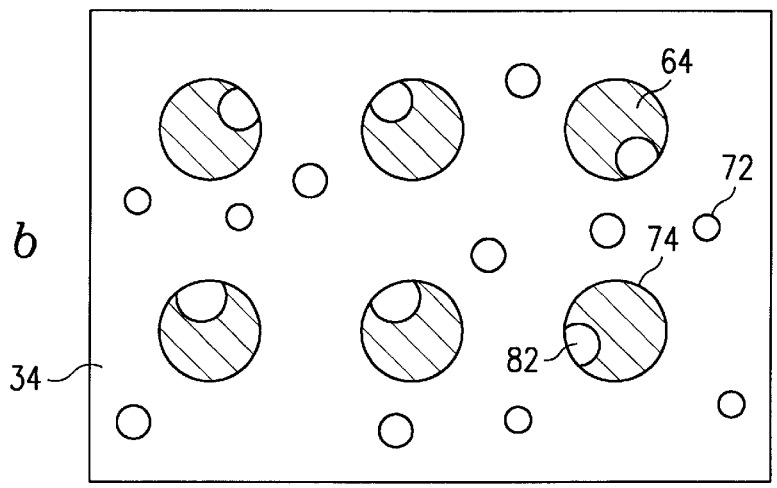

The first preferred embodiment is to anneal the substrate after some Pt nuclei have nucleated on it, in order to promote Ostwald ripening. FIG. 11a illustrates a sample where more than one nucleus forms over some of the plugs. A small amount of Pt (30Å) is deposited at 600° C. and at a rate of 0.5 Å/sec. by DC magnetron sputter deposition using Ar gas. Of course, the particular operating parameters on the sputtering system should be optimized to achieve a large grain size for the Pt. The sample is their annealed ex-situ at 500° C. for 30 min. in $N_2$ at atmospheric pressure. During annealing, small Pt nuclei become smaller and eventually disappear, while larger, more stable nuclei grow at the expense of the smaller nuclei, as shown in FIG. 11b.During this process, two small, closely spaced nuclei 80 will rearrange such that only one Pt nucleus 82 remains.

The nuclei density generally can be controlled primarily with two parameters: substrate temperature and deposition rate. Larger nuclei spacings can be obtained during a continuous deposition by: (1) increasing the substrate temperature, (2) decreasing the growth rate, and (3) changing the surface diffusion rate. While the first two options should provide improvement, they can be limited in the extent to which they can be utilized. Decreasing the growth rate results in a slower process and therefore a higher cost, while increasing the substrate temperature consumes more of the thermal budget, or could break down the barrier layer between the oxidizable layer and the oxygen stable layer.

Controlling the surface diffusion rate also provides larger nuclei spacing, and can be done by: (a) modifying the surfaces (e.g., slightly oxidizing the TiN surface), (b) providing a different gas ambient such as a gas mixture (e.g., $H_2+N_2$, Ar, $N_2$, $CO_2+N_2$, $CO+N_2$, $O_2$, $O_2Ar$ or $N_2$, or combinations of these gasses) and different gas pressure, and/or (c) providing an additional energy source (e.g., photons (UV or visible), electrons or ions). As an example, the surface diffusion rate of Pt is much larger in an oxygen environment than in an inert gas or reducing atmosphere. Note that adding oxygen might be beneficial not only during Ostwald ripening but also during deposition of the Pt. The nuclei spacing should be scaled to the plug diameter, therefore. for smaller plugs, smaller spacings are possible and less effort is required.

Figure 12:
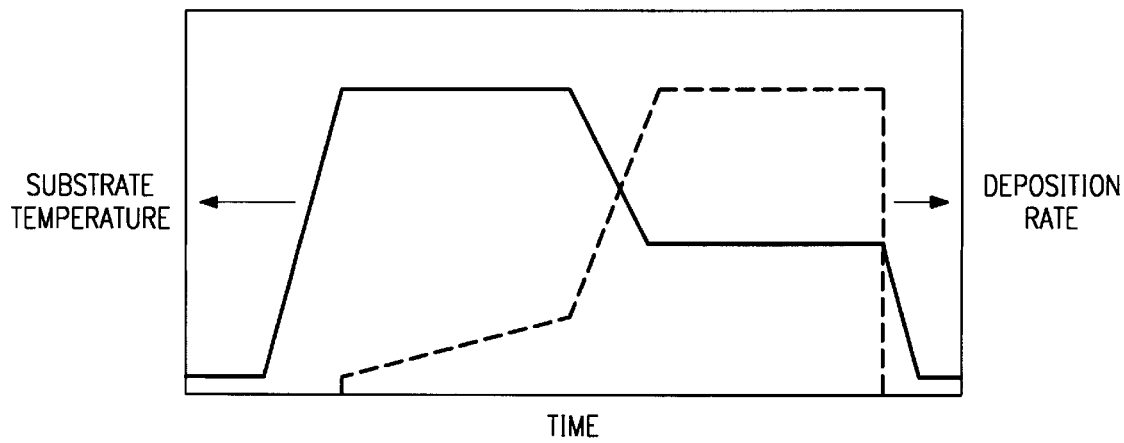
FIG. 12 is a plot of substrate temperature and deposition rate vs. time for forming a Pt layer on a microelectronic structure.

A three step method to perform the Pt deposition utilizing Ostwald ripening can be used to reduce cost while maximizing nuclei spacing. The first step is deposition of a thin Pt layer at high temperatures utilizing a low deposition rate and short deposition time. The second step is to perform Ostwald ripening in a furnace via a batch type process. The third step is to deposit the rest of the Pt. varying the deposition rate and substrate temperature in order to prevent new Pt nuclei from forming and to keep deposition time short and the thermal budget down. A preferred profile for the deposition rate and temperature is shown in FIG. 12. Key features highlighted by this plot are to start off with a low deposition rate and a high Substrate temperature at the beginning in order to prevent new Pt nuclei from forming. As the Pt nuclei grow bigger and closer together the deposition rate can be increased. Once coalescence has occurred, the deposition rate can be increased to maximize the throughput and the substrate temperature can be lowered to reduce the thermal budget. Note that the substrate temperature should be kept relatively hot in order to control the stress in the Pt layer (Hren, et. al., "Hillock Formation in Pt Films." Proc. MRS (Spring 1992). A preferred embodiment uses the same sputter deposition system described above to deposit the thicker layer of Pt. First, the substrate is brought to 600° C. and 200 Å of Pt are deposited while ramping the rate linearly from 0.5 Å/sec. to 6 Å/sec. At that point, the substrate temperature is rapidly decreased to 350° C. while increasing the deposition rate to 30 Å/sec., until a total of 3500 Å of Pt has been deposited. Of course, the final deposition thickness may vary depending on the desired final height of the bottom electrode.

Alternatively, the Pt is DC magnetron sputtered using $Ar+O_2$ gas. The oxygen is added simultaneously with the Pt deposition, and promotes the surface diffusion of the Pt. Only a small amount of oxygen is added in order to prevent serious oxidation of the TiN layer. The amount of oxygen is preferably less than about 5%, more preferably less than 2% and most preferably about 1% (about $10^4$ Torr).

Alternatively, the Pt is deposited using only the profile described above, without the initial Pt thin layer deposition or the anneal. This process is much shorter and hence cheaper, but is probably limited to very small plugs. In contrast, the initial Pt thin layer deposition and anneal allow the use of larger plugs. while still obtaining a Pt layer without grain boundaries over the plug.

Alternatively, the Pt is deposited at a constant temperature 450° C., and for the first 200 Å of Pt the deposition rate is linearly increased from 0.5 Å/sec. to 6 Å/sec., after which the rate is increased again to 30 Å/sec. and held there until the final thickness of 3500 Å is achieved. In general, although the specific temperature ranges will vary depending on the specific material being used, when depositing the oxygen stable layer, temperatures above 450° C. are considered high temperatures and temperatures below that are considered low temperatures. In addition. when depositing the oxygen stable layer, deposition rates above 10 Å/sec are considered high deposition rates, while rates below that are considered low deposition rates. The thickness of the initial thin layer of oxygen stable material is preferably less than 100 Å, more preferably less than 60 Å, and most preferably about 30 Å. The final thickness of the oxygen stable layer is preferably in the range of 300 Å to 10,000 Å, and is most preferably about 3500 Å.

Figure 13A:
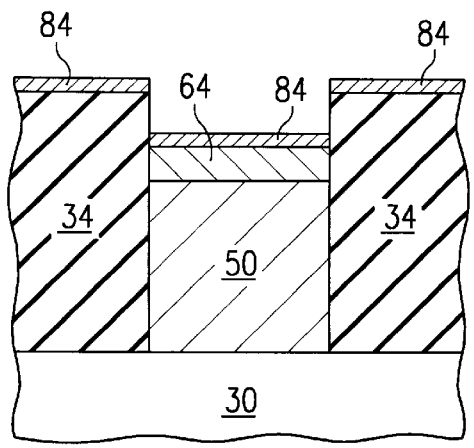
FIGS. 13a–b are cross-sectional views of a microelectronic structure before and after Ostwald ripening of the Pt layer.
Figure 13B:
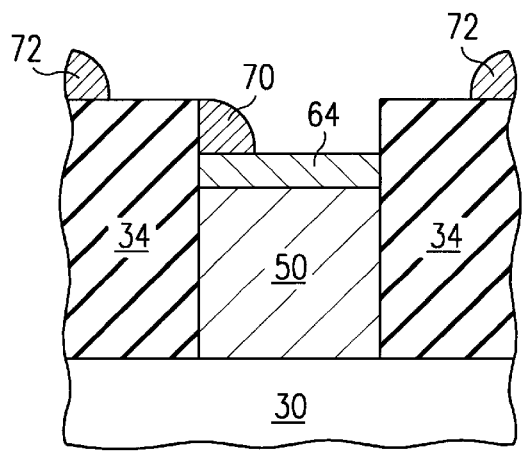

Alternatively, Ostwald ripening can be used as the primary technique for forming a single grain per plug as shown in FIG. 13. In this embodiment, Pt is deposited at low temperature in order to form many nuclei, so that a thin continuous Pt film 84 forms on recessed TiN 64 and on $SiO_2$ 34. The sample is then annealed allowing Ostwald ripening to occur such that a single Pt grain balls up in the plug (Pt 70), while Pt grains also form on the surface (Pt 72).

It should be noted that if the plug sizes are relatively small, such as 0.15 μm, it might be sufficient to form the film using a deposition profile such as shown in the plot of FIG. 12, or even by continuous deposition at a relatively high rate at a constant or varying substrate temperature such as shown above. If sputtering is the deposition technique, there are many other process parameters that also can be adjusted in order to maximize the grain size, which generally could achieve the same result as increasing the nuclei spacing.

Figure 14A:
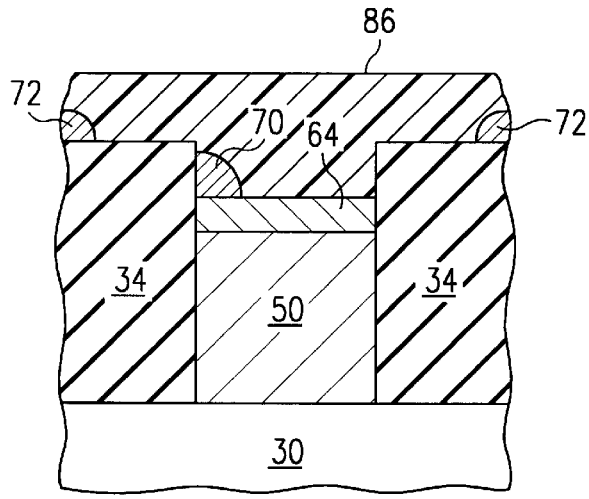
FIGS. 14a–b are cross-sectional views of a microelectronic structure illustrating the use of photoresist to remove the Pt nuclei from the top surface.
Figure 14B:
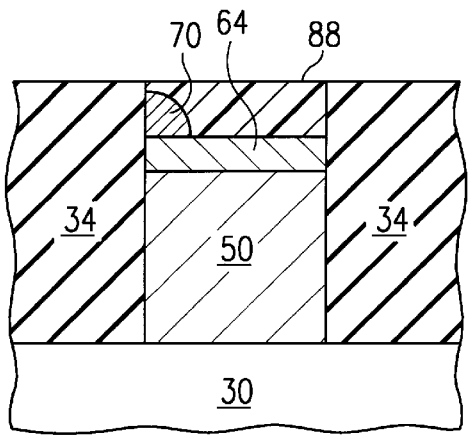

The second preferred embodiment for reducing the occurrence of grain boundaries over the plug is shown in FIG. 14. With this technique, Pt nucleus 70 is formed on the TiN 64, and Pt nuclei 72 are also formed on the $SiO_2$ 34, as described above. Photoresist 86 (any planarizing polymer may be used) is spun onto the entire structure as shown in FIG. 14a. Dry etching is then used to planarize the photoresist 88 so that it only remains in the plugs, covering Pt nucleus 70. but not Pt nuclei 72. Next, Pt nuclei 72 are etched from the surface of $SiO_2$ 34 using a dry etch such as a high density, low pressure reactive ion etch (RIE), as shown in FIG. 14b. After removing the remaining photoresist 88 and annealing to promote Ostwald ripening, this sample has an optimal structure for further single crystal Pt growth in the plug until coalescence. Further deposition by almost any technique should result in a large depletion region around each plug. which will prevent further nucleation of Pt. Selective chemical vapor deposition of the remaining Pt provides an additional advantage to the process. During selective CVD the Pt will only grow on Pt that is already present, and it should not nucleate anywhere else. Thus, further Pt deposition occurs only through growth of the single crystal Pt 72 located in the plugs, preferably to a thickness of 3500 Å.

Figure 15A:
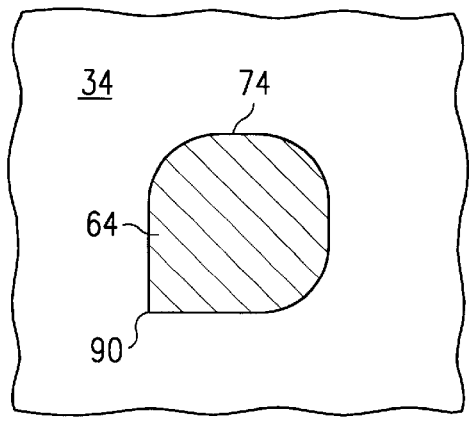
FIGS. 15a–b are top-down views of a microelectronic structure showing a plug comprising a cusp, and the formation of a Pt nucleus at the cusp.
Figure 15B:
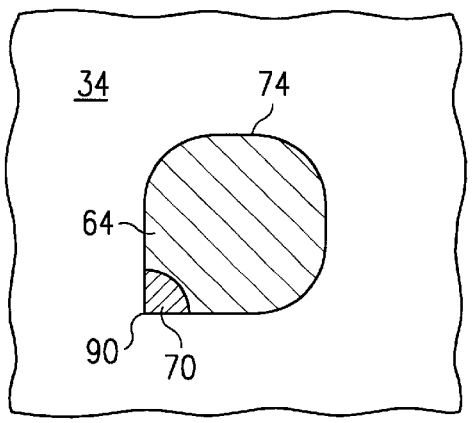

The third preferred embodiment for reducing the occurrence of grain boundaries over the plugs is shown in the top down view of FIG. 15. A cusp 90 is created in plug 74 during plug formation. In the same way that Pt has a higher probability of nucleating at the bottom edge of the recessed plug as shown in FIG. 8, cusp 90 shown in FIG. 15a will further enhance Pt nucleation. By forming only one cusp per plug, there is a better chance that only one Pt nucleus 70 will form in each plug, as shown in FIG. 15b. Note that one disadvantage to this technique is that it requires slightly more and/or higher resolution photolithography in order to define the cusp. In general, the opening or plug can be many different shapes (round, circular, oval, etc.), with the optimum shape being one that promotes the formation of a single nucleus of the oxygen stable layer material.

Figure 16A:
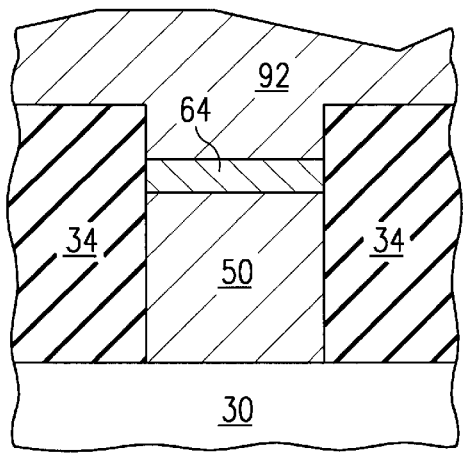
FIGS. 16a–e are cross-sectional views of a microelectronic structure showing the progressive steps in the fabrication of an HDC material capacitor after formation of the Pt layer.
Figure 16B:
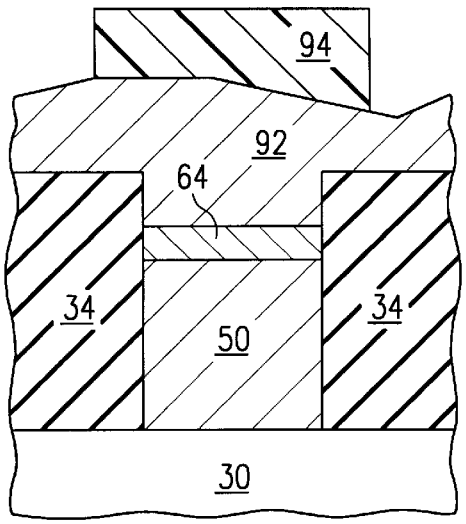
Figure 16C:
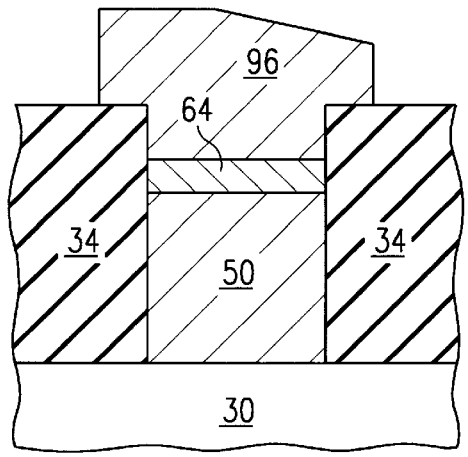
Figure 16D:
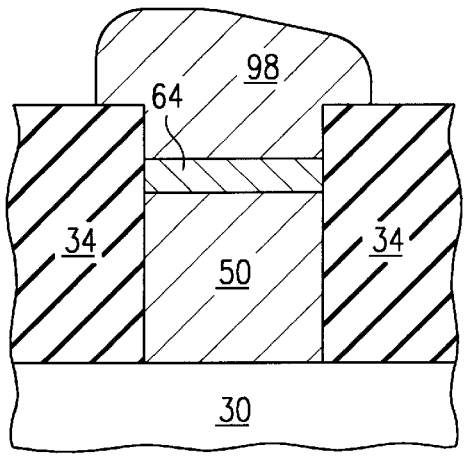
Figure 16E:
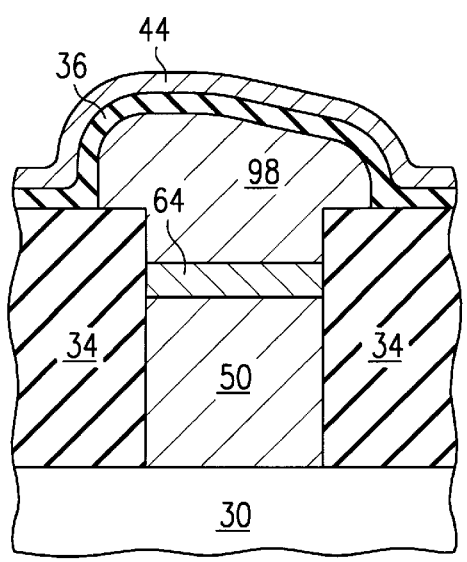

After using one of the many techniques described above to form the Pt layer, a structure is formed similar to that shown in FIG. 16a, in which there are no grain boundaries in Pt layer 92 overlying the TiN 64 in the plug. The final step in forming the bottom electrode is to pattern it to the desired final shape. Photoresist 94 is deposited and patterned as shown in FIG. 16b. Pt layer 92 is then dry etched in a high density low pressure RIE, and then the photoresist is removed. resulting in the structure shown in FIG. 16c. The Pt is then reannealed at 550° C. for 30 min. in $N_2$ in order to allow the Pt to re-adjust its shape after etching, removing stress and smoothing the sharp corners formed by the etching step, as shown in FIG. 16d. Finally, FIG. 16e illustrates the structure after the HDC material 36 and the top electrode 44 have been deposited. Alternatively, it may be possible to not rem,ove the mask that was used to pattern the openings in the interlayer dielectric until after the initial deposition of Pt. That way, the mask can be lifted off to remove any Pt. That way, the mask can be lifted off to remove any Pt nuclei that formed outside of the plug opening.

A few preferred embodiments have been described in detail herein above. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples. Unless otherwise stated, all composition ratios or percentages are in relation to composition by weight.

With respect to the materials described, there are many alternatives available, some of which are listed below. Although Pt is the preferred material for single crystal oxygen stable layer 98, alternative materials include the following: Ru, Rh, Pd, Re, Ir, Au, Ag, plus alloys between any of the preceding. Other materials which might be used for the oxygen stable layer include: conductive oxides, such as simple binary oxides including ruthenium oxide, rhenium oxide, osmium oxide, rhodium oxide, iridium oxide, tin oxide, indium oxide, and such as conductive perovskite like materials including $YBa_2Cu_3O_{7-x}$ (La,Sr)$CoO_3$, $SrRuO_3$ and many others. The oxygen stable layer may be doped or undoped. An important aspect of the "single crystal" oxygen stable layer is that it not have any grain boundaries connected all the way from the HDC material layer down to the barrier layer. Some grain boundaries may exist that do not connect the two layers, and thus still do not allow oxygen to diffuse down to the barrier layer. For example, grain boundaries formed between devices on the integrated circuit may be perfectly acceptable.

Semi conductor substrate 30 may be silicon-on-insulator, germanium, or gallium arsenide. Interlayer dielectrics 34 and 38 are preferably silicon dioxide ($SiO_2$), but examples of alternatives include the following: $Si_3N_4$, Si-N, Si-O, Si-O-N, doped versions of $SiO_2$ and the previously listed materials, $TiO_2$, $Al_2O_3$, $ZrO_2$, MgO, $Ta_2O_5$, $V_2O_5$, $Y_2O_3$, and $Nb_aO_5$. Note that the interlayer dielectric may comprise multiple layers of different materials or combinations of the above materials. Note also that the notation "A—B—C" indicates that the material may exist in varying compositions of the elements A, B. and C, an example being "Si—O—N".

As used herein, the term "oxidizable layer" refers to a conductive layer underneath the barrier layer, and is usually above the substrate or some other conductive layer used to make electrical connections to the substrate, which becomes more insulating when oxidized. The oxidizable layer may include the substrate itself. Oxidizable layer 50 is preferably phosphorus-doped polysilicon, but examples of alternative materials include the following: Ti—N, Ti—Al—N, W, Cu, Al—Cu, Al, Ti, Ti—Si—N, W—Si—N, Ti—Si, Ta—Si, W—Si, and $TiSi_2$.

Barrier layer 42 is preferably TiN, but examples of alternative barrier materials include the following: Ta—N, Ta—Al—N, Ti—Al—N, Ti—Si—N, W—Si—N, Ru—N, W—N, Ru—Al—N, Ru—Si—N, Cr—N, Cr—Al—N, Mo—N, Mo—Al—N, Mo—Si—N, V—N, V—Si—N, V—Al—N, Hf—N, Hf—Al—N, ternary (or greater) nitrides (such as Ta—Si—N, Ta—B—N, Ti—B—N), Zr—N, Y—N, Sc—N, La—N, nitrogen deficient Al—N, doped Al—N, Mg—N, Ca—N, Sr—N, Ba—N, alloys of the above. Additional alternative barrier materials include noble-metal-insulator alloys such as Pt—Si—N, Pd—Si—O, Pd—Si—O, Pd—B—(O,N), Pd—Al—N, Ru—Si—(O, N), Ir—Si—O, Re—Si—N, Rh—Al—O, Au—Si—N, and Ag—Si—N. Note that the barrier layer may comprise multiple layers of different materials or combinations of the above materials. Oxidizable layer 50 and barrier layer 42 may be separated by a silicide layer, such as $TiSi_2$.

There may be an adhesion-promoting layer between barrier layer 42 and oxygen stable layer 98. which is conductive and is preferably Ti—Al—N. A thin layer of silicon can also function as an adhesion-promoting layer. During subsequent thermal processing, this layer would react with the bottom electrode to form a very thin silicide layer, which could then serve as an adhesion-promoting layer. Since the amount of silicon is limited based on the deposited thickness, the amount of silicide formed would be small, and self-limiting. This is unlike the case where the barrier between the polysilicon plug and the bottom electrode fails. In that case, the reaction is not self-limiting and leads to catastrophic device failure. The thin silicide layer formed at the base of the electrode may also be sufficiently oxidation resistant, since a thin $SiO_2$ layer could form in a self-passivating manner on the small exposed region. Note that due to the thickness of this layer. this would have an insubstantial impact on the overall performance of the capacitor.

The high-dielectric-constant material layer 36 is preferably Ba—Sr—Ti—O ((Ba. Sr)$TiO_3$) having a thickness in the range of approximately 3 nm to 150 nm, but preferably about 25 nm. Examples of alternative materials include $Ta_2O_5$, PZT, $Ba_{1-x}Sr_xTi_{1-y}Zr_yO_3$ (or, more generally, BSZT), $Pb_{1-x}La_xTi_{1-y}Zr_yO3$ (or, more generally, PLZT), and $Bi_2A_{1-x}B_xO_{3x-3}$(or, more generally, layered perovskite family of materials) where A is Ba, Sr, Ca, Pb, or Ga, and B is Ti, Ta, Zr, or Nb. The high-dielectric-constant material layer 36 may be doped or undoped. Top electrode 44 is preferably TiN, but alternative materials include those listed above for the oxygen stable layer, plus Ti—N, Ti—Al—N, Ta—N, Ta—Al—N, W—N, W—Al—N, Cr—N, Cr—Al—N, Ru—N, Ru—Al—N, Mo—N, Mo—Al—N, V—N. V—Al—N, Hf—N, and Hf—Al—N.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, said method comprising: forming an array of microelectronic structures, wherein said forming of each of said microelectronic structures comprises forming a barrier layer on an oxidizable layerl, wherein said oxidizable layer and said barrier layer form a plug in an opening in an interlayer dielectric formed on a semiconductor substrate, wherein said plug is recessed below a top surface of said interlayer dielectric;

depositing a single crystal oxygen stable layer on said barrier layer, wherein said depositing of said oxygen stable layer comprises forming a train nucleus of said oxygen stable layer on a top surface of said barrier layer;

forming grain nuclei on said top surface of said interlayer dielectric;

depositing photoresist on said microelectronic structure;

planarizing said photoresist down to said top surface of said interlayer dielectric;

removing said grain nuclei from said top surface of said interlayer dielectric with a reactive ion etch; and removing remaining portions of said photoresist from said opening; and depositing a high-dielectric-constant material layer on said oxygen stable layer, whereby said single crystal oxygen stable layer prevents oxidation of said barrier layer and said oxidizable layer.

2. The method of claim 1 wherein said opening is round.

3. The method of claim 1 wherein said oxygen stable layer fills and extends out of said opening.

4. The method of claim 1 wherein said depositing of said oxygen stable layer comprises forming a grain nucleus of said oxygen stable layer at an intersection of a top surface of said barrier layer and a side surface of said interlayer dielectric.

5. The method of claim 4 wherein said opening is round with a cusp, and said grain nucleus forms at said cusp.

6. The method of claim 1, wherein said depositing of said oxygen stable layer further comprises using selective chemical vapor deposition to complete said oxygen stable layer.

7. The method of claim 1 wherein said depositing of said oxygen stable layer comprises first using a first deposition rate at a first substrate high temperature, followed by a faster deposition rate at a cooler substrate low temperature.

8. The method of claim 1 wherein said oxygen stable layer is Pt.

9. A method of fabricating a high-dielectric-constant material capacitor, said method comprising:

forming an opening in a surface of an interlayer dielectric formed on a semiconductor substrate; forming a doped polysilicon layer in said opening;

forming a TiN layer on said doped polysilicon layer, wherein said TiN and polysilicon layers form a recessed plug in said opening;

depositing a single crystal Pt layer on said TiN layer, said Pt layer extending out of said opening, wherein said depositing of said single crystal Pt layer comprises forming a grain nucleus of Pt on an exposed surface of said TiN layer;

forming Pt grain nuclei on said surface of said interlayer dielectric;

depositing photoresist on said interlayer dielectric, said TiN layer, and said Pt nuclei;

planarizing said photoresist down to said surface of said interlayer dielectric;

removing said grain nuclei from said surface of said interlayer dielectric with a reactive ion etch; and removing remaining portions of said photoresist from said opening;

depositing a high-dielectric-constant material layer on said oxygen stable layer; and depositing an upper electrode on said high-dielectric-constant material layer.

10. The method of claim 7 wherein said first deposition rate is between approximately 0.5 Angstroms per second and approximately 6 Angstroms per second.

11. The method of claim 7 wherein said first substrate temperature is approximately 600 degrees C.

12. The method of claim 7 wherein said faster deposition rate is approximately 30 Angstroms per second.

13. The method of claim 7 wherein said cooler substrate temperature is approximately 350 degrees C.

14. The method of claim 7 wherein said first deposition rate is between approximately 0.5 Angstroms per second and approximately 6 Angstroms per second and said faster deposition rate is approximately 30 Angstroms per second.

15. The method of claim 7 wherein said first substrate temperature is approximately 600 degrees C. and said cooler substrate temperature is approximately 350 degrees C.

* * * * *